United States Patent
Archibald et al.

(10) Patent No.: US 7,852,697 B2
(45) Date of Patent: * Dec. 14, 2010

(54) INTEGRATED CIRCUIT FEATURE DEFINITION USING ONE-TIME-PROGRAMMABLE (OTP) MEMORY

(75) Inventors: James L. Archibald, Schnecksville, PA (US); Kang W. Lee, Allentown, PA (US); Clinton H. Holder, Jr., Slatington, PA (US); Edwin A. Muth, Bethlehem, PA (US); Kreg D. Ulery, Bethlehem, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/372,196

(22) Filed: Feb. 17, 2009

(65) Prior Publication Data

US 2009/0146687 A1  Jun. 11, 2009

Related U.S. Application Data

(63) Continuation of application No. 11/736,208, filed on Apr. 17, 2007, now Pat. No. 7,512,028.

(51) Int. Cl.
*G11C 17/18* (2006.01)
(52) U.S. Cl. .................. 365/225.7; 326/38; 326/39; 327/525
(58) Field of Classification Search .............. 326/37, 326/38; 327/525; 365/96, 200, 225.7
See application file for complete search history.

(56) References Cited

U.S. PATENT DOCUMENTS

| | | | |
|---|---|---|---|
| 4,721,868 A | 1/1988 | Cornell et al. | 307/465 |
| 5,324,681 A | 6/1994 | Lowrey et al. | 437/52 |
| 5,343,434 A | 8/1994 | Noguchi | 365/185.04 |
| 5,392,246 A | 2/1995 | Akiyama et al. | 365/200 |
| 5,502,328 A | 3/1996 | Chen et al. | 257/546 |
| 5,646,451 A | 7/1997 | Freyman et al. | 257/784 |

(Continued)

OTHER PUBLICATIONS

"A Novel Embedded OTP NVM Using Standard Foundry CMOS Logic Technology", by M. Fliesler et al., Kilopass Technology, Inc., Santa Clara, CA, www.icmtd.com, 2005, pp. 275-277.

(Continued)

*Primary Examiner*—Rexford N Barnie
*Assistant Examiner*—Jany Tran
(74) *Attorney, Agent, or Firm*—Mendelsohn, Drucker & Associates, P.C.; Edward J. Meisarosh; Steve Mendelsohn

(57) ABSTRACT

In one embodiment, a integrated circuit (IC) configurable to have any one of a plurality of different feature sets, the IC including (a) one or more feature blocks adapted to be independently enabled or disabled, (b) a one-time-programmable (OTP) memory cell for each feature block, the OTP memory cell storing a value, and (c) a feature control module for each feature block, each feature control module connected between the corresponding OTP memory cell and the corresponding feature block, and adapted to enable or disable the corresponding feature block based on the value stored in the corresponding OTP memory cell. The OTP memory cells are programmed by a vendor to select the particular feature set for the IC which is to be available to a purchaser.

20 Claims, 1 Drawing Sheet

U.S. PATENT DOCUMENTS

| | | | | |
|---|---|---|---|---|
| 6,205,077 | B1* | 3/2001 | Ferrant | 365/225.7 |
| 6,633,183 | B2 | 10/2003 | Duesman | 326/47 |
| 6,741,500 | B2 | 5/2004 | DeShazo et al. | 365/185.28 |
| 6,917,238 | B2 | 7/2005 | Abe | 327/525 |
| 7,388,770 | B2 | 6/2008 | Namekawa et al. | 365/94 |
| 2004/0239367 | A1 | 12/2004 | Elappuparackal | 326/46 |
| 2005/0146373 | A1* | 7/2005 | Yoon | 327/525 |
| 2007/0246737 | A1 | 10/2007 | Chang | 257/107 |

OTHER PUBLICATIONS

"Beating Flash Fallibility", by Charles Ng, New Electronics, www.newelectronics.co.uk, May 9, 2006, pp. 21-22.

"On-Chip Nonvolatile Memory Proves Ideal for Consumer Applications", by Charles Ng, Chip Design, Design: Memory and Power, www.kilopass.com, Apr./May 2005, 4 pages.

"Digital Design" by M. Morris Mano, 2002, Prentice Hall, Third Edition, p. 82.

* cited by examiner

INTEGRATED CIRCUIT FEATURE DEFINITION USING ONE-TIME-PROGRAMMABLE (OTP) MEMORY

This application is a continuation of U.S. patent application Ser. No. 11/736,208, filed on Apr. 17, 2007, incorporated herein by reference in its entirety.

BACKGROUND OF THE INVENTION

1. Field of the Invention

The current invention relates to integrated circuits (ICs), and in particular, to ICs having multiple features wherein the IC is designed so that one or more features may be disabled.

2. Description of the Related Art

Manufacturers of ICs sometimes offer a set of products that perform substantially similar functions but that differ in the particular features available. Products with greater quantity or quality of features typically cost more than similar products from the same IC manufacturer that offer lesser quantity or quality of features. Providing varying levels of features and prices for a set of similar products allows an IC manufacturer to meet the particular price and performance needs of a wide range of customers.

One approach to providing such a range of similar yet feature-varied IC products is to design a separate IC for each product. However, due to the revenue and cost requirements of custom-designing and custom-generating an entire IC, that solution is typically not practical for such feature-varied product sets since the limited number of customers at each price and performance point is not likely to be sufficient to justify the corresponding design and production costs of a customized IC.

Another approach to providing such a range of similar yet feature-varied IC products is to design a single multi-featured IC, wherein one or more features can be disabled by the manufacturer. This allows the manufacturer to design and produce a single type of IC, and then, at some later stage of production, differentiate the various models by turning off one or more features on one or more groups of manufactured ICs. Several ways to turn off features on a multi-featured IC are described in U.S. Pat. No. 5,646,451, issued Jul. 8, 1997 to Freyman et al., and incorporated herein by reference.

For example, a single IC mask set is designed and manufactured, which incorporates all the features of the multi-featured IC. Particular features may then be disabled or enabled during the chip-packaging process by choosing a particular way of connecting pads on the IC to each other and/or to package-external pins. For example, a particular feature may be enabled by connecting a particular pad to a package-external pin that, in operation, will connect to a power source, and that feature may be disabled by connecting that particular pad to a package-external pin that, in operation, will connect to ground voltage. However, this method of feature selection may (i) require increasing the complexity and cost of the packaging process, (ii) require the design and maintenance of multiple package-wire bonding diagrams, (iii) require closer coordination with the chip-packager, which is typically a third-party entity, (iv) allow for easier reverse-engineering of the feature-selection methodology, and (v) result in surpluses of chips having one or more feature sets, since chips are generally packaged in batches and the particular wiring configuration, and consequently the feature selection, for all chips in a batch is the same.

SUMMARY OF THE INVENTION

One embodiment of the invention can be an integrated circuit (IC) comprising (a) one or more feature blocks adapted to be independently enabled or disabled to provide any one of a plurality of feature sets for the IC, (b) one or more one-time-programmable (OTP) memory cells, one for each feature block, each OTP memory cell storing a value, and (c) one or more feature control modules, one for each feature block, each feature control module adapted to enable or disable the corresponding feature block based on the value stored in the corresponding OTP memory cell.

Another embodiment of the invention can be a method for providing any one of a plurality of feature sets for an integrated circuit (IC), wherein the IC comprises (i) one or more feature blocks adapted to be independently enabled or disabled, (ii) one or more one-time-programmable (OTP) memory cells, one for each feature block, each OTP memory cell storing a value, and (iii) one or more feature control modules, one for each feature block. The method comprises, for each feature block: (a) providing the value stored in the corresponding OTP memory cell to the corresponding feature control module, and (b) controlling the feature block, by the corresponding feature control module, to enable or disable the feature block based on the value stored in the corresponding OTP memory cell.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
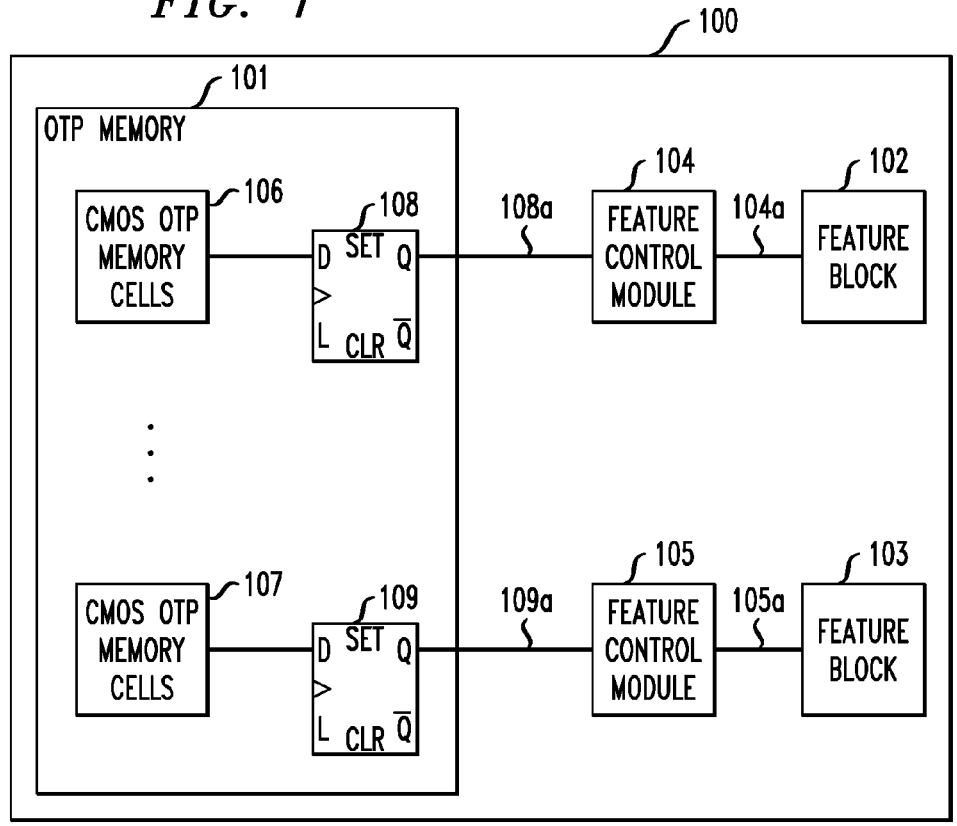
FIG. 1 shows a simplified block diagram of an IC according to one embodiment of the invention.

Integrated Circuits (ICs) can use stored memory to control the provision of power or other essential signals to select component groups. Thus, stored memory can be used to enable or disable selected features in a multi-featured IC. Some types of memory are better suited for this task than others.

ICs typically use read-only memory (ROM) to store firmware and other information that does not typically need to be changed after manufacture. ROM is a type of nonvolatile memory (NVM), i.e., ROM maintains its memory contents even after it is powered off. CMOS ICs can include CMOS-component ROM that is set in the masks used to create the IC. That ROM is consistent across all ICs produced from a particular mask set, and thus is not field- or factory-programmable. Thus, using ROM might not provide greater feature-selection flexibility than using custom wire bonding.

An IC can include programmable ROM (PROM), which is field-programmable. However, since PROM and CMOS components typically use different manufacturing processes, integrating the two types of components on a single IC die increases the complexity and cost of die manufacturing. Having the CMOS and PROM components on different dies does not increase die manufacturing costs and complexity for each die, but since two dies are required, system complexity and costs increase. For similar reasons, integrating CMOS components with EPROM (erasable PROM) or EEPROM (electronically erasable PROM) NVMs is also problematic. Thus, using PROM might not provide greater cost saving than using custom wire bonding for feature selection.

One-time-programmable (OTP) memory refers to a type of nonvolatile memory (NVM) that uses standard CMOS components and can consequently be easily and cheaply integrated with a CMOS circuit on a single die. OTP memory consequently allows for the relatively simple and inexpensive integration on a CMOS IC of a field-programmable ROM. OTP memory can consequently be used to allow feature selection that may be more flexible and less costly than using custom wire bonding.

Several types of OTP memory have been developed. One example is XPM (from "eXtra Permanent Memory") from Kilopass Technology, Inc., of Santa Clara, Calif. XPM memory utilizes standard dual-oxide CMOS technology. XPM memory uses an antifuse principle for programming, wherein the conductivity characteristics of programmed components are transformed from a non-conductive state to a conductive state by the application of a sufficiently high voltage or current. An XPM memory cell comprises a thin-oxide transistor. The programming circuits are constructed using thick-oxide transistors. During programming, particular voltages are applied to selected transistors, which cause the gate oxide of those transistors to break down, thus programming the cell.

Using OTP memories allows for multi-featured ICs to be designed and manufactured wherein each IC is manufactured and packaged in the same way and the feature selection is performed on the packaged IC by appropriately programming OTP memory cells. Programming appropriate OTP memory cells enables or disables particular features of the multi-featured IC. The feature selection may be accomplished by controlling the provision of static or dynamic power to components that control the availability of particular features. Typically, the OTP memory programming would be performed by the IC manufacturer who will also appropriately label the IC package to correctly identify the model corresponding to the selected feature set. The OTP memory programming could also be performed by others in the chain of production and sale, such as the packager or an IC vendor.

FIG. 1 shows a simplified block diagram of IC 100 according to one embodiment of the invention. IC 100 comprises OTP memory block 101, one or more feature blocks such as feature blocks 102 and 103, and one or more corresponding feature control modules, such as feature control modules 104 and 105, respectively. OTP memory block 101 comprises one or more OTP memory cells such as OTP memory cells 106 and 107. Each OTP memory cell uses support circuitry in OTP memory block 101 for reading and writing (not shown). OTP memory cell 106 controls the availability of feature block 102, while OTP memory cell 107 controls the availability of feature block 103. OTP memory cell 106 is coupled to feature block 102 via feature control module 104, while OTP memory cell 107 is coupled to feature block 103 via feature control module 105.

During OTP-memory programming, each of OTP memory cells 106 and 107 is independently set to be either "0" (low) or "1" (high). In one implementation, setting an OTP memory cell to "0" disables the corresponding feature block, while setting the OTP memory cell to "1" enables the corresponding feature block. In an alternative implementation, the converse is true, wherein setting an OTP memory cell to "1" disables the corresponding feature block, while setting the OTP memory cell to "0" enables the corresponding feature block. In another alternative implementation, the effect of setting a particular OTP memory cell depends on the particular feature control module and corresponding feature block, wherein each pair can respond uniquely to a particular OTP-memory cell setting.

In one implementation, OTP memory block 101 includes data latches, such as data latches 108 and 109, connected between an OTP memory cell and its corresponding feature control module. When the IC is on, the data latch continuously provides an active signal to a feature control module indicative of the status of the corresponding OTP memory cell. For example, data latch 108 receives its data input from OTP memory cell 106 and provides its Q data output to feature control module 104 via signal 108a, and data latch 109 receives its data input from OTP memory cell 107 and provides its output to feature control module 105 via signal 109a. The data latches allow IC 100 to read the values of OTP memory cells once after each IC turn-on and have those values stored in the data latches and provided to the corresponding feature control modules when IC 100 is powered and operating. This allows IC 100 to avoid multiple or lengthy data reads of OTP memory block 101. In an alternative embodiment, a feature control module, such as feature control module 105, can use as an input the ~Q data output, i.e., the inverse of the Q data output, of the corresponding data latch, such as data latch 108. In an alternative embodiment, a feature control module, such as feature control module 105, can use as inputs both the Q and ~Q data outputs of the corresponding data latch, such as data latch 108.

Figure 2:
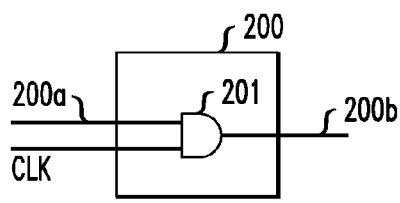
FIG. 2 shows a simplified block diagram of an implementation of a feature control module of FIG. 1 in accordance with an embodiment of the invention.

FIG. 2 shows a simplified block diagram of an implementation of feature control module 200, in accordance with an embodiment of the invention. Feature control module 200 provides an implementation of feature control modules such as feature control modules 104 and 105 of FIG. 1. Feature control module 200 is suggested for a feature block that uses dynamic power and can be enabled or disabled by supplying or cutting off a clock signal.

Feature control module 200 comprises AND gate 201. One input of AND gate 201 is clock signal CLK. Another input of AND gate 201 is control signal 200a, which indicates the status of a corresponding OTP memory cell. Control signal 200a can correspond, for example, to signal 108a of FIG. 1. AND gate 201 outputs, to a corresponding feature block, output signal 200b. Output signal 200b can correspond, for example, to signal 104a provided to feature block 102, or to signal 105a provided to feature block 103. If control signal 200a is high, then output signal 200b is substantially equivalent to clock signal CLK, allowing the corresponding feature block to fully function. If control signal 200a is low, then output signal 200b is substantially zero, preventing the corresponding feature block from fully functioning.

The function of feature control module 200 is using control signal 200a to control the output provided to the corresponding feature block, wherein the output is either a constant value, e.g., high or low, or a value corresponding to clock signal CLK. A person of ordinary skill in the art would appreciate that in alternative embodiments, AND gate 201 can be replaced by other logic circuitry that performs substantially the same function. For example, feature control module 200 would function substantially the same if AND gate 201 were replaced with a NOR gate having inverting inputs. For example, if AND gate 201 is replaced with a NAND gate, then feature control module could control the availability of the corresponding feature block by outputting (i) a constant high when control signal 200*a* is low, and (ii) a signal substantially equivalent to the inverse of clock signal CLK when control signal 200*a* is high.

As used herein in reference to two signals, the term "correspond" and its variants refer to a second signal based on a first signal such that the second signal is substantially equivalent to either (i) the first signal or (ii) the inverse of the first signal.

Figure 3:
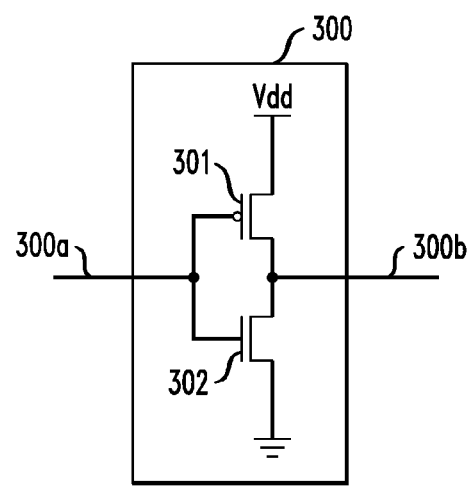
FIG. 3 shows a simplified block diagram of another implementation of a feature control module of FIG. 1 in accordance with an embodiment of the invention.

FIG. 3 shows a simplified block diagram of an implementation of feature control module 300, in accordance with an embodiment of the invention. Feature control module 300 provides an implementation of feature control modules such as feature control modules 104 and 105 of FIG. 1. Feature control module 300 is suggested for a feature block that uses static power and can be enabled or disabled by supplying or cutting off a power-supply signal.

Feature control module 300 comprises PMOS 301 and NMOS 302 connected to form an inverter. The gates of PMOS 301 and NMOS 302 are controlled by control signal 300*a*, which can correspond to control signal 108*a* of FIG. 1. PMOS 301 is connected between power supply Vdd (source) and output signal 300*b* (drain), which can correspond to output signal 104*a*. NMOS 302 is connected between a reference voltage (source), e.g., ground, and output signal 300*b* (drain). If control signal 300*a* is high, then PMOS 301 is off, NMOS 302 is on, and output signal 300*b* is substantially equal to the reference voltage, which prevents the corresponding feature block, such as feature block 102, from fully functioning. If control signal 300*a* is low, then PMOS 301 is on, NMOS 302 is off, and output signal 300*b* is substantially equal to power supply voltage Vdd, which allows the corresponding feature block, such as feature block 102, to fully function.

In an alternative implementation, feature control module 300 comprises two sequential inverters so that if control signal 300*a* is high, then output signal 300*b* is substantially equal to power supply voltage Vdd, and if control signal 300*a* is low, then output signal 300*b* is substantially equal to the reference voltage.

In an alternative embodiment, the data latches, such as data latches 108 and 109, are located within IC 100 but not within OTP memory block 101.

In an alternative embodiment, "0" may be defined as high and "1" as low. Additional reversals of signals and/or definitions may be made, with corresponding inversions as appropriate.

In an alternative implementation, devices other than PMOS and NMOS transistors, but with similar operating characteristics, are used in implementing one or more feature control modules.

In one alternative embodiment, data latches are not used to store values of OTP memory cells for provision to corresponding feature control modules. Instead, in one implementation, the OTP memory cells remain in read mode during operation for as long as necessary. In another implementation, other systems and/or methods are used to provide values of OTP memory cells to corresponding feature control modules.

Exemplary embodiments of the invention have been provided using PMOS and NMOS field-effect transistors (FETs). As would be appreciated by a person of ordinary skill in the art, a particular transistor can be replaced by many other kinds of transistors, with appropriate inversions of signals, orientations, or voltages, as necessary, and without departing from the scope of the invention.

Exemplary embodiments of the invention have been provided using an OTP memory cells block; however, the invention is not limited to a single cohesive block of OTP memory cells on an IC. The IC may contain several separate blocks of OTP memory cells which may share common circuitry such as a conversion switch, reset protection circuitry, and/or other common circuitry, or may each have their own instances of that circuitry, or may be arranged so that some blocks of OTP memory cells share some common circuitry while other blocks do not share that circuitry.

References herein to the verb "to set" and its variations in reference to values of memory cells do not necessarily require an active step and may include leaving a memory cell value unchanged if its default value is the desired value. Setting a value may nevertheless include performing an active step even if the previous or default value is the desired value. Similarly, references herein to values "stored" in memory cells, or memory cells "storing" values, do not necessarily require a previous active step. As such, a stored value, or the value a memory cell is storing, may be a memory cell's default value.

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing steps in a software program. Such software may be employed in, for example, a digital signal processor, microcontroller, or general-purpose computer.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. The terms "directly coupled," "directly connected," etc., imply that the connected elements are either contiguous or connected via a conductor for the transferred energy.

For purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "output node" refers generically to either the source or drain of a metal-oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when the present invention is implemented using bi-polar transistor technology.

We claim:

1. An integrated circuit (IC) comprising:
    (a) two or more feature blocks adapted to be independently enabled or disabled to provide any one of a plurality of feature sets for the IC;
    (b) two or more one-time-programmable (OTP) memory cells, one for each feature block, each OTP memory cell storing a value;
    (c) two or more feature control modules, one for each feature block, each feature control module adapted to enable or disable the corresponding feature block based on the value stored in the corresponding OTP memory cell; and
    (d) a data latch for each feature block, wherein each data latch is:
        (i) connected between the corresponding OTP memory cell and the corresponding feature control module; and
        (ii) adapted to read the value stored in the corresponding OTP memory cell only once after the IC is turned on and then continuously provide to the feature control module, when the IC is operating, a value corresponding to the value stored in the corresponding OTP memory cell.

2. The IC of claim 1, wherein:
    at least one of the two or more feature control modules comprises digital logic circuitry having (i) a first input based on the value stored in the corresponding OTP memory cell, and (ii) a second input that is different from the first input; and
    the at least one feature control module is adapted to output to the corresponding feature block (i) a first substantially constant value to disable the feature block if the first input has a feature-disable value, and (ii) a signal corresponding to the second input to enable the feature block if the first input has a feature-enable value.

3. The IC of claim 1, wherein the feature control module comprises:
    (a) a first transistor connected between a power-supply voltage and an output provided to the corresponding feature block to enable or disable the feature block; and
    (b) a second transistor connected between the output and a reference voltage, wherein the gates of the first and second transistors are connected to an input signal, which is based on the value stored in the corresponding OTP memory cell, such that the output is (i) substantially equal to the power-supply voltage if the input signal has a first control value, and (ii) substantially equal to the reference voltage if the input signal has a second control value.

4. The IC of claim 3, wherein the reference voltage is ground voltage.

5. The IC of claim 3, wherein the first and second transistors are CMOS transistors.

6. The IC of claim 5, wherein the first transistor is a PMOS transistor and the second transistor is an NMOS transistor.

7. The IC of claim 1, wherein the OTP memory cells are CMOS OTP memory cells.

8. The IC of claim 1, wherein:
    the two or more feature blocks include a first feature block and a second feature block; and
    the first feature block provides a first feature set for the IC that is different from a second feature set for the IC provided by the second feature block.

9. A method for providing any one of a plurality of feature sets for an integrated circuit (IC), wherein the IC comprises (i) two or more feature blocks adapted to be independently enabled or disabled, (ii) two or more one-time-programmable (OTP) memory cells, one for each feature block, each OTP memory cell storing a value, and (iii) a data latch for each feature block, each data latch connected between the corresponding OTP memory cell and the corresponding feature block, the method comprising, for each feature block:
    (a) receiving the value stored in the corresponding OTP memory cell, wherein step (a) comprises:
        (i) reading, by the corresponding data latch, the value stored in the corresponding OTP memory cell only once after the IC is turned on; and
        (ii) continuously receiving, from the corresponding data latch, a value corresponding to the value stored in the corresponding OTP memory cell; and
    (b) controlling the feature block to enable or disable the feature block based on the value stored in the corresponding OTP memory cell.

10. The method of claim 9, further comprising independently setting each OTP memory cell to store the value to enable or disable the corresponding feature block.

11. The method of claim 9, further comprising, for each feature block:
    receiving a first input based on the value stored in the corresponding OTP memory cell;
    receiving a second input that is different from the first input;
    outputting a first substantially constant value to disable the feature block if the first input has a feature-disable value; and
    outputting a signal corresponding to the second input to enable the feature block if the first input has a feature-enable value.

12. The method of claim 11, wherein the second input is a clock signal.

13. The method of claim 12, comprising, for each feature block:
   outputting the feature-disable value, if the first input has the feature-disable value; and
   outputting the clock signal, if the first input has the feature-enable value.

14. The method of claim 9, wherein the OTP memory cells are CMOS OTP memory cells.

15. The method of claim 9, wherein:
   the two or more feature blocks include a first feature block and a second feature block; and
   the first feature block provides a first feature set for the IC that is different from a second feature set for the IC provided by the second feature block.

16. An integrated circuit (IC) comprising:
   (a) two or more feature blocks adapted to be independently enabled or disabled to provide any one of a plurality of feature sets for the IC;
   (b) two or more one-time-programmable (OTP) memory cells, one for each feature block, each OTP memory cell storing a value; and
   (c) two or more feature control modules, one for each feature block, each feature control module adapted to enable or disable the corresponding feature block based on the value stored in the corresponding OTP memory cell, wherein:
      at least one of the two or more feature control modules comprises digital logic circuitry having (i) a first input based on the value stored in the corresponding OTP memory cell, and (ii) a second input that is different from the first input; and
      the at least one feature control module is adapted to output to the corresponding feature block (i) a first substantially constant value to disable the feature block if the first input has a feature-disable value, and (ii) a signal corresponding to the second input to enable the feature block if the first input has a feature-enable value.

17. The IC of claim 16, wherein:
(1) the feature control module comprises:
   (a) a first transistor connected between a power-supply voltage and an output provided to the corresponding feature block to enable or disable the feature block; and
   (b) a second transistor connected between the output and a reference voltage, wherein the gates of the first and second transistors are connected to an input signal, which is based on the value stored in the corresponding OTP memory cell, such that the output is (i) substantially equal to the power-supply voltage if the input signal has a first control value, and (ii) substantially equal to the reference voltage if the input signal has a second control value
(2) the first and second transistors are CMOS transistors, wherein the first transistor is a PMOS transistor and the second transistor is an NMOS transistor; and
(3) the OTP memory cells are CMOS OTP memory cells.

18. A method for providing any one of a plurality of feature sets for an integrated circuit (IC), wherein the IC comprises (i) two or more feature blocks adapted to be independently enabled or disabled and (ii) two or more one-time-programmable (OTP) memory cells, one for each feature block, each OTP memory cell storing a value, the method comprising, for each feature block:
   (a) receiving the value stored in the corresponding OTP memory cell;
   (b) controlling the feature block to enable or disable the feature block based on the value stored in the corresponding OTP memory cell;
   (c) receiving a first input based on the value stored in the corresponding OTP memory cell;
   (d) receiving a second input that is different from the first input;
   (e) outputting a first substantially constant value to disable the feature block if the first input has a feature-disable value; and
   (f) outputting a signal corresponding to the second input to enable the feature block if the first input has a feature-enable value.

19. The method of claim 18, wherein the second input is a clock signal, comprising, for each feature block:
   outputting the feature-disable value, if the first input has the feature-disable value; and
   outputting the clock signal, if the first input has the feature-enable value.

20. The method of claim 18, wherein the OTP memory cells are CMOS OTP memory cells.

* * * * *